United States Patent
Majima

(10) Patent No.: US 12,244,280 B2
(45) Date of Patent: Mar. 4, 2025

(54) SIGNAL PROCESSING CIRCUIT

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Hideaki Majima, Tokyo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 18/616,377

(22) Filed: Mar. 26, 2024

(65) Prior Publication Data
US 2024/0267013 A1 Aug. 8, 2024

Related U.S. Application Data

(63) Continuation of application No. 17/392,544, filed on Aug. 3, 2021, now Pat. No. 11,973,477.

(30) Foreign Application Priority Data

Sep. 24, 2020 (JP) .................. 2020-159321

(51) Int. Cl.
H03F 3/45 (2006.01)
H01P 1/36 (2006.01)
(Continued)

(52) U.S. Cl.
CPC ........... *H03F 3/45475* (2013.01); *H01P 1/36* (2013.01); *H03G 3/30* (2013.01); *H03K 5/24* (2013.01);
(Continued)

(58) Field of Classification Search
CPC .................................................. H03F 3/45475
See application file for complete search history.

(56) References Cited

U.S. PATENT DOCUMENTS 4,475,558 A 10/1984 Brock
6,160,455 A 12/2000 French et al.
(Continued)

FOREIGN PATENT DOCUMENTS

JP H08288757 A 11/1996
JP 2002507069 A 3/2002
(Continued)

OTHER PUBLICATIONS

Office Action issued on Apr. 23, 2024, in corresponding Japanese Application No. 2020-159321, 3 pages.

*Primary Examiner* — Patricia T Nguyen
(74) *Attorney, Agent, or Firm* — Maier & Maier, PLLC

(57) ABSTRACT

According to one embodiment, a signal processing circuit includes a first voltage setting circuit that sets a reference voltage on an input side of an isolator, a variable gain amplifier circuit that amplifies an output signal of the isolator, a DC offset adjustment circuit that adjusts an offset of the variable gain amplifier circuit, a second voltage setting circuit that sets a reference voltage on an output side of the isolator, and a control circuit that controls the DC offset adjustment circuit in response to a result of comparison of an output voltage of the variable gain amplifier circuit with an output voltage of the second voltage setting circuit.

14 Claims, 2 Drawing Sheets

(51) Int. Cl.
*H03G 3/30* (2006.01)
*H03K 5/24* (2006.01)

(52) U.S. Cl.
CPC . *H03F 2200/375* (2013.01); *H03G 2201/103* (2013.01)

(56) References Cited

U.S. PATENT DOCUMENTS

| | | | | |
|---|---|---|---|---|
| 7,420,410 | B2* | 9/2008 | Ohba | H03F 3/45977 330/253 |
| 8,055,229 | B2* | 11/2011 | Huang | H03G 3/3052 455/245.2 |
| 2002/0045461 | A1 | 4/2002 | Bongfeldt | |
| 2003/0030491 | A1* | 2/2003 | Hart | H03G 1/0088 330/254 |
| 2003/0157915 | A1 | 8/2003 | Atkinson et al. | |
| 2004/0137862 | A1* | 7/2004 | Tanaka | H03D 3/007 455/127.3 |
| 2006/0132235 | A1* | 6/2006 | Ozawa | H03H 11/1291 330/254 |
| 2008/0111625 | A1* | 5/2008 | Fukuzawa | G01C 19/5607 330/261 |
| 2009/0072903 | A1* | 3/2009 | Bae | H03F 3/45098 330/254 |
| 2012/0206201 | A1* | 8/2012 | Mizokami | H03F 3/45179 330/254 |
| 2013/0156141 | A1 | 6/2013 | Eo et al. | |
| 2014/0195577 | A1 | 7/2014 | Nikitin | |
| 2020/0067467 | A1 | 2/2020 | Choe et al. | |

FOREIGN PATENT DOCUMENTS

| | | |
|---|---|---|
| JP | 2009038556 A | 2/2009 |
| JP | 2018196227 A | 12/2018 |

* cited by examiner

SIGNAL PROCESSING CIRCUIT

CROSS-REFERENCE TO RELATED APPLICATIONS

The present application is a continuation of U.S. patent application Ser. No. 17/392,544, filed on Aug. 3, 2021, which claims the benefit of priority to Japanese Patent Application No. 2020-159321, filed on Sep. 24, 2020, the entire contents of each of which are incorporated by reference in the present application.

FIELD

The present embodiment generally relates to a signal processing circuit.

BACKGROUND

A signal processing circuit that includes an isolator has been disclosed conventionally. An isolator isolates an input side and an output side thereof. That is, an isolator electrically insulates the input side and the output side and allows transmission of a signal between the input side and the output side. Therefore, it is suitable for, for example, a signal processing circuit that isolates a high voltage side and a low voltage side thereof and executes signal processing. However, a voltage that is provided as a reference may be discontinuous on an input side and an output side of an isolator, by interposing the isolator therebetween, so as to cause destabilization of signal processing. A signal processing circuit is desired that is capable of executing stable signal processing while taking advantage of an isolator.

DETAILED DESCRIPTION

According to one embodiment, a signal processing circuit includes an isolator with an input side and an output side that are electrically insulated, a first voltage setting circuit that is provided on the input side of the isolator and outputs a reference voltage on the input side of the isolator to the input side of the isolator, a variable gain amplifier circuit that amplifies an output signal of the isolator, a DC offset adjustment circuit that adjusts an offset of the variable gain amplifier circuit, a second voltage setting circuit that sets a reference voltage on the output side of the isolator, a comparison circuit that compares an output voltage of the variable gain amplifier circuit with an output voltage of the second voltage setting circuit, and a control circuit that controls the DC offset adjustment circuit in response to an output signal of the comparison circuit.

Hereinafter, a signal processing circuit according to an embodiment will be explained in detail with reference to the accompanying drawings. Additionally, the present invention is not limited by these embodiments.

First Embodiment

Figure 1:
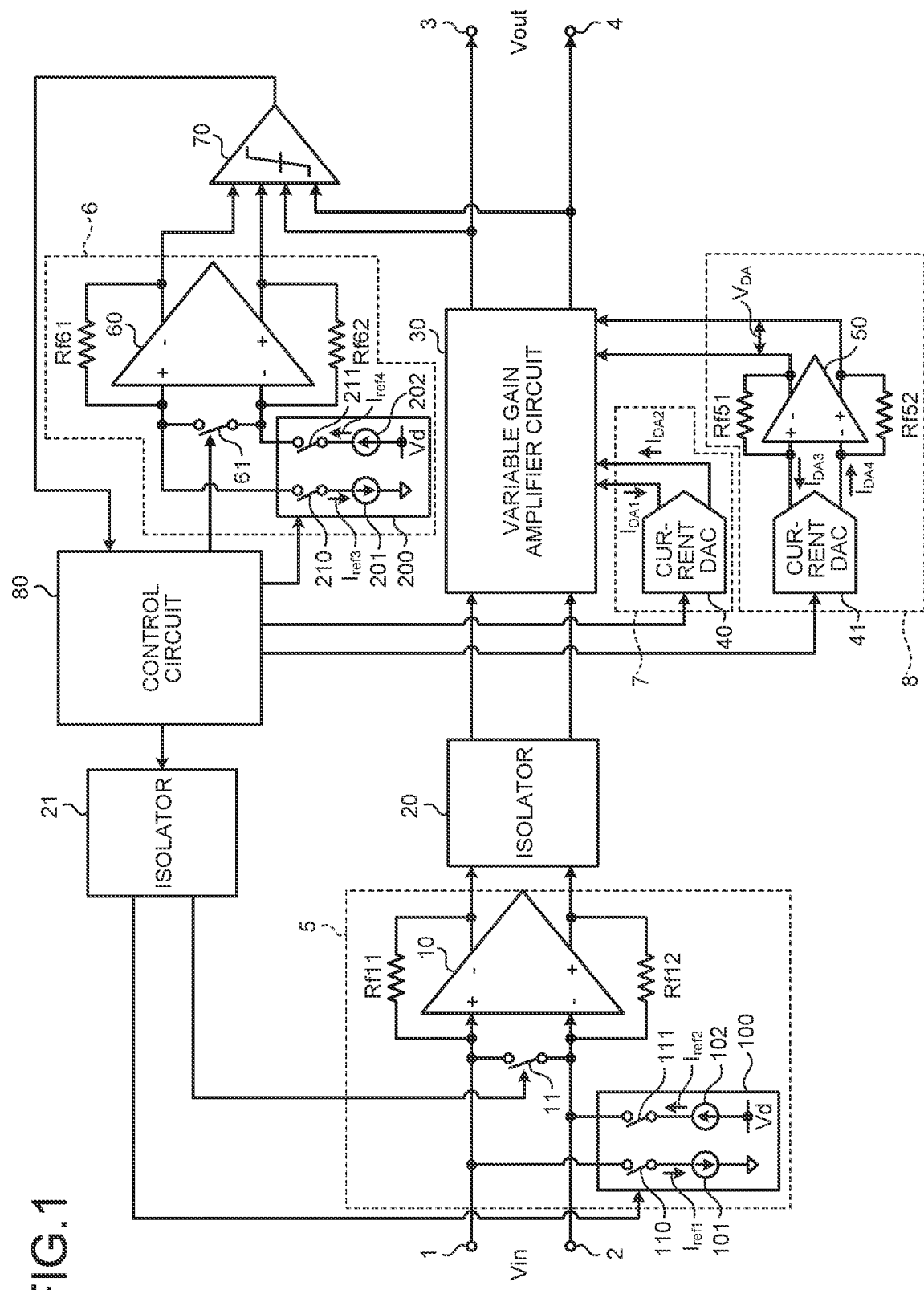
FIG. 1 is a diagram that illustrates a configuration of a signal processing circuit according to a first embodiment.

FIG. 1 is a diagram that illustrates a configuration of a signal processing circuit according to a first embodiment.

The present embodiment has an isolator 20. The isolator 20 isolates an input side and an output side. That is, an isolator 20 electrically insulates the input side and the output side and allows transmission of a signal between the input side and the output side. It has, for example, a capacitive or inductive configuration. It has a voltage setting circuit 5 on an input side of the isolator 20.

The voltage setting circuit 5 has a constant current source 100. The constant current source 100 has constant current sources 101 and 102. The constant current source 101 is connected to an input terminal 1 through a switch 110. The constant current source 102 is connected to an input terminal 2 through a switch 111. The constant current sources 101, 102 supply constant currents $I_{ref1}$, $I_{ref2}$. The constant current source 101 outputs a constant current $I_{ref1}$ on a side of ground and the constant current source 102 outputs a constant current $I_{ref2}$ from a side of a power source Vd to a side of the input terminal 2. For example, constant currents $I_{ref1}$, $I_{ref2}$ are set at identical values. An input voltage Vin is applied between the input terminals 1, 2.

The voltage setting circuit 5 has a fully-differential amplifier circuit 10. A non-inverting input terminal (+) of the amplifier circuit 10 is connected to the input terminal 1 and an inverting input terminal (−) thereof is connected to the input terminal 2. A feedback resistor Rf11 is connected between the non-inverting input terminal (+) and an inverting output terminal (−) thereof and a feedback resistor Rf12 is connected between the inverting input terminal (−) and a non-inverting output terminal (+) thereof. A voltage at an output terminal of the amplifier circuit 10 is set by the feedback resistors Rf11, Rf12 and constant currents $I_{ref1}$, $I_{ref2}$ that are supplied from the constant current source 100. An output voltage at the inverting output terminal (−) of the amplifier circuit 10 is set by a constant current $I_{ref1}$ that is supplied to the non-inverting input terminal (+) and the feedback resistor Rf11 and an output voltage at the non-inverting output terminal (+) is set by a constant current $I_{ref2}$ that is supplied to the inverting input terminal (−) and the feedback resistor Rf12.

It has a switch 11 between the non-inverting input terminal (+) and the inverting input terminal (−) of the amplifier circuit 10. As the switch 11 is turned on, shorting is caused between the non-inverting input terminal (+) and the inverting input terminal (−) of the amplifier circuit 10, so that an output voltage of the amplifier circuit 10 is zero. When the switches 110, 111 of the constant current source 100 are turned on and the switch 11 is turned off, the voltage setting circuit 5 supplies a predetermined setting voltage to the isolator 20. Additionally, the switch 11 may be provided between the inverting output terminal (−) and the non-inverting output terminal (+) of the amplifier circuit 10. As it is provided between the inverting output terminal (−) and the non-inverting output terminal (+) of the amplifier circuit 10, it is possible to adjust an input voltage to the isolator 20 so as to be zero accurately.

The present embodiment has a variable gain amplifier circuit 30 on an output side of the isolator 20. The variable gain amplifier circuit 30 amplifies and outputs a signal from the isolator 20. An output voltage Vout of the variable gain amplifier circuit 30 are supplied to output terminals 3, 4 and is supplied to a comparison circuit 70. A configuration example of the variable gain amplifier circuit 30 will be described later.

The present embodiment has a DC offset adjustment circuit 7 that adjusts a DC offset of the variable gain amplifier circuit 30. The DC offset adjustment circuit 7 has a current DAC 40. The current DAC 40 supplies currents $I_{DA1}$, $I_{DA2}$ with current values that are adjusted in response to a control signal from a control circuit 80 to the variable gain amplifier circuit 30. The current DAC 40 generates a current $I_{DA1}$ that flows out of the variable gain amplifier circuit 30 and a current $I_{DA2}$ that flows into the variable gain amplifier circuit 30. That is, the current DAC 40 generates and outputs currents $I_{DA1}$, $I_{DA2}$ that are provided in positive and negative relations to the variable gain amplifier circuit 30.

The present embodiment has a gain adjustment circuit 8. The gain adjustment circuit 8 has a current DAC 41 and a fully-differential amplifier circuit 50. The current DAC 41 supplies currents $I_{DA3}$, $I_{DA4}$ with current values that are adjusted in response to a control signal from the control circuit 80 to the amplifier circuit 50. The current DAC 41 generates a current $I_{DA3}$ that flows out of a non-inverting input terminal (+) of the amplifier circuit 50 and a current $I_{DA4}$ that flows into an inverting input terminal (−) of the amplifier circuit 50. That is, the current DAC 41 generates and outputs currents $I_{DA3}$, $I_{DA4}$ that are provided in positive and negative relations to the amplifier circuit 50.

A feedback resistor Rf51 is connected between the non-inverting input terminal (+) and an inverting output terminal (−) of the amplifier circuit 50 and a feedback resistor Rf52 is connected between the inverting input terminal (−) and a non-inverting output terminal (+) thereof. The amplifier circuit 50 outputs an adjustment voltage $V_{DA}$ that is determined by currents $I_{DA3}$, $I_{DA4}$ from the current DAC 41 and resistance values of the feedback resistors Rf51, Rf52. Gain adjustment of the variable gain amplifier circuit 30 is executed by an adjustment voltage VA. Currents $I_{DA3}$, $I_{DA4}$ of the current DAC 41 are adjusted depending on a control signal from the control circuit 80, so that an adjustment voltage $V_{LA}$ that is output by the gain adjustment circuit 8 is adjusted.

The present embodiment has a voltage setting circuit 6 that sets a reference voltage on an output side of the isolator 20. The voltage setting circuit 6 has a current source 200 and a fully-differential amplifier circuit 60. The current source 200 has constant current sources 201 and 202. The constant current sources 201, 202 supply constant currents $I_{ref3}$, $I_{ref4}$. The constant current source 201 outputs a constant current $I_{ref3}$ on a side of ground and the constant current source 202 outputs a constant current $I_{ref4}$ from a side of the power source Vd to a side of the amplifier circuit 60. For example, constant currents $I_{ref3}$, $I_{ref4}$ are set at identical values.

A feedback resistor Rf61 is connected between a non-inverting input terminal (+) and an inverting output terminal (−) of the fully-differential amplifier circuit 60 and a feedback resistor Rf62 is connected between an inverting input terminal (−) and a non-inverting output terminal (+) thereof. A voltage at an output terminal of the amplifier circuit 60 is set by the feedback resistors Rf61, Rf62 and constant currents $I_{ref3}$, $I_{ref4}$ that are supplied from the current source 200.

An output voltage at the inverting output terminal (−) of the amplifier circuit 60 is set by a constant current $I_{ref3}$ that is supplied to the non-inverting input terminal (+) and the feedback resistor Rf61 and an output voltage at the non-inverting output terminal (+) is set by a constant current $I_{ref4}$ that is supplied to the inverting input terminal (−) and the feedback resistor Rf62. For example, an output voltage of the voltage setting circuit 6 is set so as to be equal to an output voltage of the voltage setting circuit 5 as already described.

It has a switch 61 between the non-inverting input terminal (+) and the inverting input terminal (−) of the amplifier circuit 60. As the switch 61 is turned on, shorting is caused between input terminals of the amplifier circuit 60, so that an output voltage of the amplifier circuit 60 is zero. When switches 210, 211 of the constant current source 200 are turned on and the switch 61 is turned off, the voltage setting circuit 6 supplies a predetermined setting voltage to the comparison circuit 70. Additionally, the switch 61 may be provided between the inverting output terminal (−) and the non-inverting output terminal (+) of the amplifier circuit 60. As it is provided between the inverting output terminal (−) and the non-inverting output terminal (+) of the amplifier circuit 60, it is possible to adjust an input voltage to the comparison circuit 70 so as to be zero accurately.

The comparison circuit 70 compares an output voltage of the variable gain amplifier circuit 30 with an output voltage of the voltage setting circuit 6 and supplies a signal that is dependent on a result of comparison to the control circuit 80. The control circuit 80 controls the DC offset adjustment circuit 7 and the gain adjustment circuit 8 in response to a signal from the comparison circuit 70. The control circuit 80 generates and supplies a signal that controls each of the switches 61, 210, 211 of the voltage setting circuit 6, and generates, and supplies through an isolator 21, a signal that controls each of the switches 11, 110, 111 of the voltage setting circuit 5.

(DC Offset Adjustment)

DC offset adjustment of the variable gain amplifier circuit 30 that is executed by the control circuit 80 is executed according to an undermentioned procedure. The switches 11, 110, 111 of the voltage setting circuit 5 on an input side of the isolator 20 are turned on. Thereby, an output voltage that is supplied from the amplifier circuit 10 to the isolator 20 is set at zero.

The switches 61, 210, 211 of the voltage setting circuit 6 on an output side of the isolator 20 are turned on. Thereby, an output voltage that is supplied from the amplifier circuit 60 to the comparison circuit 70 is set at zero.

That is, DC offset adjustment of the variable gain amplifier circuit 30 is executed in a state where output voltages from the voltage setting circuits 5 and 6 are set at zero. The control circuit 80 controls the DC offset adjustment circuit 7 in response to an output signal of the comparison circuit 70. Currents $I_{DA1}$, $I_{DA2}$ of the current DAC 40 of the DC offset adjustment circuit 7 are adjusted in such a manner that an output voltage of the variable gain amplifier circuit 30 is equal to an output voltage of the voltage setting circuit 6 that is set at zero.

The current DAC 40 is configured in such a manner that currents $I_{DA1}$, $I_{DA2}$ are provided in positive and negative relations as already described. In such a configuration, for example, a difference value of currents $I_{DA1}$, $I_{DA2}$ that are supplied to the variable gain amplifier circuit 30 is doubled by control that increases currents $I_{DA1}$, $I_{DA2}$, so that it is possible to execute DC offset adjustment of the variable gain amplifier circuit 30 efficiently.

Additionally, the number of current DACS 40 may be increased in such a manner that they are provided, for example, for fine adjustment and coarse adjustment of a DC offset of the variable gain amplifier circuit 30. A configuration is provided in such a manner that a DC offset is first adjusted by using a current DAC for coarse adjustment (non-illustrated) and the DC offset is then adjusted by using a current DAC for fine adjustment (non-illustrated), so that it is possible to adjust a DC offset of the variable gain amplifier circuit 30 efficiently and accurately.

(Gain Adjustment)

Gain adjustment of the variable gain amplifier circuit 30 that is executed by the control circuit 80 is executed according to an undermentioned procedure. The switches 110, 111 of the voltage setting circuit 5 are tuned on and the switch 11 thereof is turned off. Thereby, an output voltage that is set by constant currents $I_{ref1}$, $I_{ref2}$ of the constant current source 100 and the feedback resistors Rf11, Rf12 is supplied from the amplifier circuit 10 to the isolator 20. The variable gain amplifier circuit 30 amplifies, and supplies to the comparison circuit 70, an output voltage of the isolator 20.

In the voltage setting circuit 6 on an output side of the isolator 20, the switches 210, 211 are turned on and the switch 61 is turned off. Thereby, an output voltage that is set by constant currents $I_{ref3}$, $I_{ref4}$ of the current source 200 and the feedback resistors Rf61, Rf62 is supplied from the amplifier circuit 60 to the comparison circuit 70.

The comparison circuit 70 compares an output voltage from the variable gain amplifier circuit 30 with an output voltage from the voltage setting circuit 6 and supplies an output signal that is dependent on a result of such comparison to the control circuit 80. The control circuit 80 controls the gain adjustment circuit 8 in such a manner that an output voltage of the variable gain amplifier circuit 30 is equal to an output voltage of the voltage setting circuit 6, in response to an output signal of the comparison circuit 70.

For example, in a case where a gain of the variable gain amplifier circuit 30 is set at "1", a gain of the variable gain amplifier circuit 30 is adjusted by an adjustment voltage $V_{DA}$ from the gain adjustment circuit 8 in such a manner that an output voltage from the isolator 20 is directly output from between the output terminals 3, 4.

The current DAC 41 of the gain adjustment circuit 8 is configured in such a manner that currents $I_{DA3}$, $I_{DA4}$ are provided in positive and negative relations as already described. In such a configuration, for example, a difference value of currents $I_{DA3}$, $I_{DA4}$ that are supplied to the amplifier circuit 50 is doubled by control that increases currents $I_{DA3}$, $I_{DA4}$, so that it is possible for the gain adjustment circuit 8 to generate an adjustment voltage VA efficiently and supply it to the variable gain amplifier circuit 30.

The first embodiment has the voltage setting circuits 5, 6 that respectively set predetermined reference voltages on an input side and an output side of the isolator 20, the DC offset adjustment circuit 7 that adjusts a DC offset of the variable gain amplifier circuit 30 that amplifies an output signal of the isolator 20, and the gain adjustment circuit 8 that adjust a gain. The DC offset adjustment circuit 7 and the gain adjustment circuit 8 are controlled by the control circuit 80 based on a result of comparison of the comparison circuit 70 that compares an output voltage of the variable gain amplifier circuit 30 with an output voltage of the voltage setting circuit 6. For example, the voltage setting circuit 6 that sets a voltage that is identical to that of the voltage setting circuit 5 on an input side of the isolator 20 is included on an output side of the isolator 20, and a DC offset and a gain of the variable gain amplifier circuit 30 are adjusted by using such a setting voltage. Hence, even if an input side and an output side of the isolator 20 are electrically insulated, it is possible to adjust a DC offset and a gain of the variable gain amplifier circuit 30 in a stable state thereof, so that it is possible to provide a signal processing circuit that executes stable signal processing. Additionally, it is possible to provide a configuration where DC offset adjustment and gain adjustment of the variable gain amplifier circuit 30 are automatically implemented under control of the control circuit 80 at a time of activation of a signal processing circuit.

Figure 2:
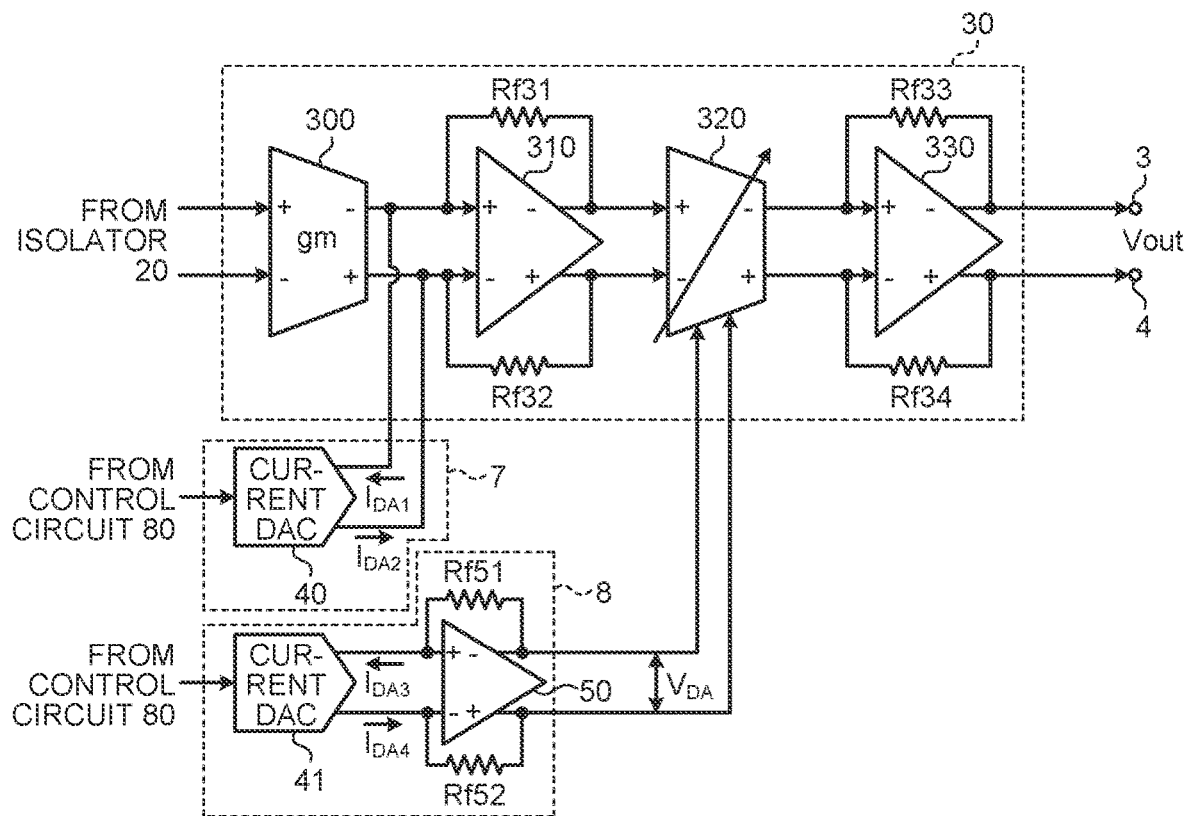
FIG. 2 is a diagram that illustrates one embodiment of a variable gain amplifier circuit.

FIG. 2 is a diagram that illustrates one embodiment of a variable gain amplifier circuit. It is possible to use it as the variable gain amplifier circuit 30 according to the first embodiment as already described. A component that corresponds to that of an embodiment as already described will be provided with an identical sign so as to provide a redundant description only in case of need. Hereinafter, the same applies. The variable gain amplifier circuit 30 has a Gm cell 300. The Gm cell 300 is composed of, for example, an Operational Transconductance Amplifier (OTA), converts a voltage that is supplied from the isolator 20 into a current, and outputs it.

An output current of the Gm cell 300 is supplied to a fully-differential amplifier circuit 310. A feedback resistor Rf31 is connected between a non-inverting input terminal (+) and an inverting output terminal (−) of the amplifier circuit 310 and a feedback resistor Rf32 is connected between an inverting input terminal (−) and a non-inverting output terminal (+) thereof.

Currents $I_{DA1}$, $I_{DA2}$ from the DC offset adjustment circuit 7 are supplied to the non-inverting input terminal (+) and the inverting input terminal (−) of the amplifier circuit 310. Voltages, that are set by currents that are provided by adding output currents from the Gm cell 300 and currents $I_{DA1}$, $I_{DA2}$ from the DC offset adjustment circuit 7 and values of the feedback resistors Rf31, Rf32, are output from the non-inverting output terminal (+) and the inverting output terminal (−) of the amplifier circuit 310. That is, the amplifier circuit 310 outputs an output voltage that is adjusted by the DC offset adjustment circuit 7.

An output voltage of the amplifier circuit 310 is supplied to a variable gain amplifier 320. A gain of the variable gain amplifier 320 is adjusted by an adjustment voltage $V_{DA}$ from the gain adjustment circuit 8. As a gain of the variable gain amplifier 320 is adjusted, it is possible to adjust a gain of the variable gain amplifier circuit 30.

Output currents of the variable gain amplifier 320 are supplied to a fully-differential amplifier circuit 330. An output voltage of the amplifier circuit 330, that is determined by output currents of the variable gain amplifier 320, a feedback resistor Rf33 that is connected between the non-inverting input terminal (+) and the inverting output terminal (−) and a feedback resistor Rf34 that is connected between the inverting input terminal (−) and the non-inverting output terminal (+), is supplied to the output terminals 3, 4.

The variable gain amplifier circuit 30 according to the present embodiment has the amplifier circuit 310 with a DC offset that is adjusted by a signal from the DC offset adjustment circuit 7 and the variable gain amplifier 320 with a gain that is adjusted by an adjustment voltage $V_{DA}$ from the gain adjustment circuit 8. The DC offset adjustment circuit 7 and the gain adjustment circuit 8 are adjusted under control of the control circuit 80, so that it is possible to adjust a DC offset and a gain of the variable gain amplifier circuit 30.

Figure 3:
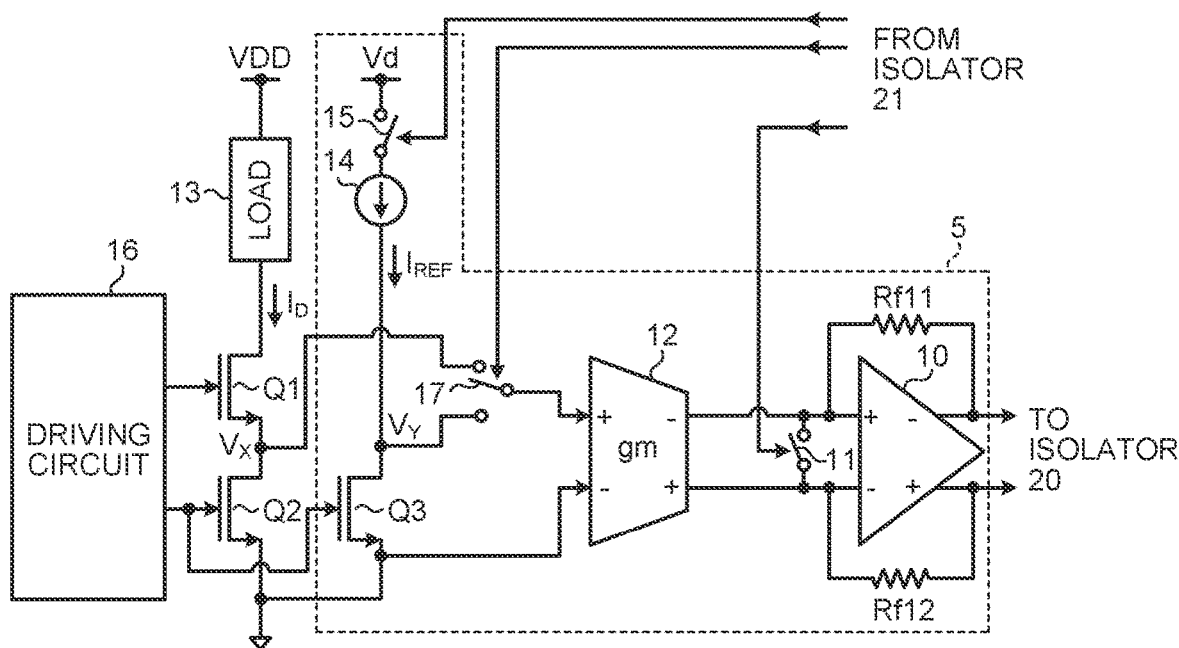
FIG. 3 is a diagram that illustrates another embodiment of a voltage setting circuit.

FIG. 3 is a diagram that illustrates another embodiment of the voltage setting circuit 5 that is provided on an input side of the isolator 20. The voltage setting circuit 5 according to the present embodiment has a constant current source 14 that outputs a constant current $I_{REF}$. The constant current source 14 is connected to the power source Vd through a switch 15. It has an NMOS transistor Q3 with a source-drain path that is a main current path and is connected to the constant current source 14 in series. The NMOS transistor Q3 is, for example, a Si transistor that is composed of silicon (Si).

The voltage setting circuit 5 has a Gm cell 12. A non-inverting input terminal (+) of the Gm cell 12 is connected to a drain of the NMOS transistor Q3 through a switch 17.

The Gm cell 12 converts a voltage that is applied between the non-inverting input terminal (+) and an inverting input terminal (−) thereof into a current and outputs it. An output current of the Gm cell 12 is supplied to the fully-differential amplifier circuit 10. The amplifier circuit 10 outputs, and supplies to the isolator 20, a voltage that is set by a current that is supplied from the Gm cell 12 and resistance values of the feedback resistors Rf11, Rf12. It is possible to set a voltage of the voltage setting circuit 5 by a drain voltage $V_Y$ that is set by a constant current $I_{REF}$ and an on-resistance $R_{ONQ3}$ of the NMOS transistor Q3 and provide it as a setting voltage on an input side of the isolator 20.

The present embodiment has an NMOS transistor Q2 that is connected to the NMOS transistor Q3 in parallel. A source of the NMOS transistor Q2 is connected to a source of the NMOS transistor Q3 and a gate thereof is connected to a gate of the NMOS transistor Q3. The NMOS transistor Q2 is, for example, a Si transistor.

It has a transistor Q1 that has a source-drain path that is connected to a source-drain path that is a main current path of the NMOS transistor Q2 in series. The transistor Q1 is, for example, a GaN transistor that is composed of gallium nitride (GaN). A drain of the transistor Q1 is connected to a load 13. A power source voltage VDD is applied to the load 13. A driving circuit 16 supplies a driving signal that controls on/off of the transistor Q1 and the NMOS transistors Q2, Q3.

As already described, in gain adjustment of the variable gain amplifier circuit 30, control is executed in such a manner that a voltage that is provided by multiplying a drain voltage $V_Y$ of the NMOS transistor Q3 (=$I_{REF} \times R_{ONQ3}$) by a voltage gain Av of the variable gain amplifier circuit 30 is equal to a setting voltage of the voltage setting circuit 6 (=$I_{ref3} \times Rf\mathbf{61}$). That is, an output voltage Vout after gain adjustment of the variable gain amplifier circuit 30 is represented by formula (1).

$$Vout = V_Y \times A_V \qquad (1)$$
$$= I_{REF} \times R_{ONQ3} \times A_V$$
$$= R_{ref3} \times Rf61$$

Formula (2) is obtained from formula (1).

$$A_V = I_{ref3} \times Rf61/I_{REF} \times R_{ONQ3} \qquad (2)$$

After gain adjustment of the variable gain amplifier circuit 30, the switch 17 is switched to a side of a drain of the NMOS transistor Q2. That is, a connection point of the non-inverting input terminal (+) of the Gm cell 12 is switched between the drain of the NMOS transistor Q2 and the drain of the NMOS transistor Q3. A drain voltage $V_X$ of the NMOS transistor Q2 is a voltage that is generated by an on-resistance $R_{ONQ2}$ of the NMOS transistor Q2 depending on a load current $I_D$.

An output voltage Vout in this case is represented by formula (3).

$$Vout = I_D \times R_{ONQ2} \times A_V \qquad (3)$$

As formula (2) is substituted into formula (3), formula (4) is obtained.

$$Vout = I_D \times R_{ONQ2} \times I_{ref3} \times Rf61/I_{REF} \times R_{ONQ3} \qquad (4)$$

As a ratio $R_{ONQ3}/R_{ONQ2}$ of on-resistances of the NMOS transistors Q2 and Q3 is denoted by Ratio, formula (5) is obtained.

$$Vout = I_D \times Rf61 \times I_{ref3}/I_{REF} \times \text{Ratio} \qquad (5)$$

That is, an output voltage Vout is represented by a load current $I_D$, a feedback resistor Rf61, a voltage gain $A_V$, a ratio of constant currents ($I_{ref3}/I_{REF}$), and a resistance ratio Ratio. A voltage gain Av is adjusted so as to be a predetermined gain, for example, "1" by gain adjustment as already described. Therefore, as an output voltage Vout is detected, it is possible to detect a state of a load current $I_D$. For example, in a case where a GaN transistor is used as the transistor Q1, a power source voltage VDD that is applied is a high voltage of about 600 V. In a configuration where an input side of the isolator 20 where the transistor Q1 is provided and a low voltage side where the variable gain amplifier circuit 30 is provided are insulated or separated, it is possible to detect a load current $I_D$ on a high voltage side that is an input side of the isolator 20, in a stable state, on a low voltage side that is an output side of the isolator 20.

Although some embodiments of the present invention have been explained, these embodiments are presented as examples and do not intend to limit the scope of the invention. These novel embodiments are capable of being implemented in various other modes and it is possible to execute a variety of omissions, substitutions, and modifications without departing from the spirit of the invention. These embodiments and/or variations thereof are included in the scope and/or spirit of the invention and are included in the scope of the invention as recited in what is claimed and equivalents thereof.

What is claimed is:

1. A signal processing circuit, comprising:
an isolator including an input side and an output side that are electrically insulated;
a variable gain amplifier circuit that amplifies an output signal of the isolator;
a DC offset adjustment circuit that adjusts a DC offset of the variable gain amplifier circuit;
a gain adjustment circuit that adjusts a gain of the variable gain amplifier circuit;
a first voltage setting circuit provided on the input side of the isolator, the first voltage setting circuit setting, based on a first control signal, a reference voltage on the input side of the isolator to zero during DC offset adjustment and to a constant voltage different from zero during gain adjustment, and outputting the reference voltage on the input side to the input side of the isolator;
a second voltage setting circuit provided on the output side of the isolator, the second voltage setting circuit setting, based on a second control signal, a reference voltage on the output side of the isolator to zero during DC offset adjustment and to a constant voltage different from zero during gain adjustment, and outputting the reference voltage on the output side to the output side of the isolator;
a comparison circuit that compares an output voltage of the variable gain amplifier circuit with an output voltage of the second voltage setting circuit; and
a control circuit that controls the DC offset adjustment circuit and the gain adjustment circuit in response to an output signal of the comparison circuit, wherein
the first voltage setting circuit includes:
a first differential amplifier circuit that includes an inverting input terminal and a non-inverting input terminal to which constant currents are supplied; and
a first switch provided between the inverting input terminal and the non-inverting input terminal of the first differential amplifier circuit;
the second voltage setting circuit includes:
a second differential amplifier circuit that includes an inverting input terminal and a non-inverting input terminal to which constant currents are supplied; and
a second switch provided between the inverting input terminal and the non-inverting input terminal of the second differential amplifier circuit; and
the control circuit outputs the first and second control signals, and controls on/off of the first and second switches to exclusively control the DC offset adjustment circuit and the gain adjustment circuit.

2. The signal processing circuit according to claim 1, wherein
the control circuit controls the DC offset adjustment circuit depending on the output signal from the comparison circuit at a time when the first switch and the second switch are in on-states.

3. The signal processing circuit according to claim 2, wherein
the control circuit controls the gain adjustment circuit depending on the output signal from the comparison circuit at a time when the first switch and the second switch are in off-states.

4. The signal processing circuit according to claim 1, wherein
the DC offset adjustment circuit includes a variable current source with a current value that is changed depending on a control signal from the control circuit, and
the variable gain amplifier circuit includes a differential amplifier circuit with an input terminal that is supplied with a current from the variable current source.

5. The signal processing circuit according to claim 2, wherein
the DC offset adjustment circuit includes a variable current source with a current value that is changed depending on a control signal from the control circuit, and
the variable gain amplifier circuit includes a differential amplifier circuit with an input terminal that is supplied with a current from the variable current source.

6. The signal processing circuit according to claim 3, wherein
the DC offset adjustment circuit includes a variable current source with a current value that is changed depending on a control signal from the control circuit, and
the variable gain amplifier circuit includes a differential amplifier circuit with an input terminal that is supplied with a current from the variable current source.

7. The signal processing circuit according to claim 1, wherein
the first voltage setting circuit includes:
a first transistor including a main current path connected to a constant current source in series;
a voltage/current conversion circuit that converts a voltage that is generated on the main current path of the first transistor into a current; and
a differential amplifier circuit including an input terminal supplied with an output current from the voltage/current conversion circuit.

8. The signal processing circuit according to claim 2, wherein
the first voltage setting circuit includes:
a first transistor including a main current path connected to a constant current source in series;
a voltage/current conversion circuit that converts a voltage that is generated on the main current path of the first transistor into a current; and
a differential amplifier circuit including an input terminal supplied with an output current from the voltage/current conversion circuit.

9. The signal processing circuit according to claim 3, wherein
the first voltage setting circuit includes:
a first transistor including a main current path connected to a constant current source in series;
a voltage/current conversion circuit that converts a voltage that is generated on the main current path of the first transistor into a current; and
a differential amplifier circuit including an input terminal supplied with an output current from the voltage/current conversion circuit.

10. The signal processing circuit according to claim 4, wherein
the first voltage setting circuit includes:
a first transistor including a main current path connected to a constant current source in series;
a voltage/current conversion circuit that converts a voltage that is generated on the main current path of the first transistor into a current; and
a differential amplifier circuit including an input terminal supplied with an output current from the voltage/current conversion circuit.

11. The signal processing circuit according to claim 7, further comprising:
a second transistor including a main current path connected to the main current path of the first transistor in parallel and that supplies an output current to a load; and
a switch that switches a connection point of one input terminal of the voltage/current conversion circuit between a drain of the first transistor and a drain of the second transistor.

12. The signal processing circuit according to claim 8, further comprising:
a second transistor including a main current path connected to the main current path of the first transistor in parallel and that supplies an output current to a load; and
a switch that switches a connection point of one input terminal of the voltage/current conversion circuit between a drain of the first transistor and a drain of the second transistor.

13. The signal processing circuit according to claim 9, further comprising:

a second transistor including a main current path connected to the main current path of the first transistor in parallel and that supplies an output current to a load; and a switch that switches a connection point of one input terminal of the voltage/current conversion circuit between a drain of the first transistor and a drain of the second transistor.

14. The signal processing circuit according to claim 10, further comprising:

a second transistor including a main current path connected to the main current path of the first transistor in parallel and that supplies an output current to a load; and a switch that switches a connection point of one input terminal of the voltage/current conversion circuit between a drain of the first transistor and a drain of the second transistor.

\* \* \* \* \*